US005861071A

United States Patent [19]

McBane

[11] Patent Number: 5,861,071

[45] Date of Patent: Jan. 19, 1999

[54] ELECTRICALLY INSULATED MAGNET WIRE AND METHOD OF MAKING THE SAME

[75] Inventor: C. David McBane, Fort Wayne, Ind.

[73] Assignee: Alconex Specialty Products, Inc., Fort Wayne, Ind.

[21] Appl. No.: 560,202

[22] Filed: Nov. 21, 1995

[51] Int. Cl.[6] ........ H05K 1/00

[52] U.S. Cl. ........ 156/54; 156/202

[58] Field of Search ........ 156/54, 202

[56] References Cited

U.S. PATENT DOCUMENTS

| | | | |
|---|---|---|---|
| 4,159,920 | 7/1979 | Andersson | 156/54 |
| 4,624,718 | 11/1986 | Hessler | 156/56 |
| 4,851,060 | 7/1989 | Wade, Jr. | 156/53 |
| 4,855,534 | 8/1989 | O'Connor | 156/54 X |
| 4,868,035 | 9/1989 | Weinberg | 428/212 |
| 5,105,057 | 4/1992 | Weinberg | 174/121 R |
| 5,254,806 | 10/1993 | Gross | 174/133 R |
| 5,274,196 | 12/1993 | Weinberg | 174/121 R |

*Primary Examiner*—Francis J. Lorin
*Attorney, Agent, or Firm*—Baker & Daniels

[57] ABSTRACT

A method of forming electrically insulated magnet wire and a coil formed therefrom. The method involves feeding a flexible electrical insulation tape along a path which converges with a path along which the wire to be wrapped is conveyed. Along the tape travel path at a location upstream of the point where the tape and wire converge, a quantity of heat activated adhesive that has been heated to a sticky state is applied to the passing tape. Then, before the adhesive coating sets, the adhesive coated tape reaches the point of convergence with the wire and is adhered to the wire to provide an electrical insulating wire wrap. The method of the invention provides for a longitudinal, partial wrapping of a conductor wire that furnishes suitable turn-to-turn insulation in coils formed with the wrapped wire.

17 Claims, 4 Drawing Sheets

ELECTRICALLY INSULATED MAGNET WIRE AND METHOD OF MAKING THE SAME

BACKGROUND OF THE INVENTION

This invention relates to insulated electrical conductors, and, in particular, to a method for forming insulated magnet wire and to a coil constructed from such insulated magnet wire.

Insulated magnet wire is typically used to form coils that create magnetic fields within electrical devices such as motors and transformers. In order to provide adequately strong magnetic fields, the coils are frequently manufactured with a multitude of overlaying layers of spirally wound wire. To ensure optimum operation of the coil, it is highly desireable that the electric current within the wire be prevented from jumping between successive windings (i.e. turn-to-turn jumping) in a coil layer, as well as prevented from jumping between successive layers (i.e. layer-to-layer) of the coil windings.

Overall, prior attempts to overcome layer-to-layer electrical current jumping have provided a workable degree of success. Such attempts frequently involved wrapping a sheet of electrically insulative material between the successive winding layers during coil manufacture. However, an assortment of existing techniques for preventing turn-to-turn electrical current jumping, while to a certain extent offering functional results, suffer from a variety of shortcomings which detract from their desirability.

For example, one technique previously employed to insulate a magnet wire is to coat the entire wire with an insulating resin or enamel. However, resin wire coatings alone are frequently susceptible to nicks or scratches during coil formation and/or use which compromises the insulating function of the coating.

An assortment of other techniques completely or partially wrap the wire with tapes or webs made of paper which absorbs oil that acts as an electrical insulator when used in an oil-filled transformer, or with tapes or webs made of insulating material, such as woven glass or NOMEX®, which are less susceptible to nicks. However, due to the relatively high cost of the tapes such as made from NOMEX®, these techniques, especially if excessive amounts of tape are utilized, make the wire product expensive. For example, one prior art technique spirally wraps the wire in a first direction with a first tape and then helically or spirally wraps the wire in a second direction with a second tape. While the second wrap may serve to stagger the tape seams such that the magnet wire is less likely to be exposed when the wrapped magnet wire is bent into a proper coil arrangement, the cost of multiple tape layers may be prohibitive for many applications.

Another known cigarette wrap type technique entails extruding onto the full circumference of a round conductor wire a heat activated adhesive. An electrically insulating wrap is then longitudinally wrapped around the entire adhesive coated wire to provide dielectric properties absent in the adhesive. A shortcoming of this technique is that because a complete wrapping of the wire is required to ensure that the wire, when eventually wound into a coil, is properly insulated, large amounts of expensive insulating tape are required.

U.S. Pat. No. 5,254,806 discloses a wire wrapping method that uses pressure sensitive adhesive on an insulating tape to wrap a magnet wire. The adhesive is covered by a release paper which is stripped from the tape immediately prior to application of the tape to the wire. A disadvantage of this method is the inconvenience of handling the release strip during wire formation. A further disadvantage is that the adhesive is flowed onto the tape and then covered with the release strip in a secondary process frequently performed by an outside supplier. The need for the precoated tape may be a source of delays and may further increase the cost of the manufacturing process.

In another method for insulating wire disclosed in U.S. Pat. No. 4,159,920, a binder coated tape is applied to a heated conductor wire. Besides requiring that heating units be provided to heat the wire before and possibly after tape application, this method further suffers from the need to use tape precoated with an adhesive, which as described above may increase the manufacturing costs of the wire.

In order to provide a magnet wire coil which utilizes less wrapped wire, one prior art design traversely winds a pair of magnet wires to form a layer. One wire of the pair is completely wrapped in insulation while the other wire is not provided with insulation. For this design, the turn to turn insulation is intended to be achieved by the insulation of the wrapped wire interposed between successive windings of the bare wire. This coil design may complicate manufacture as two wires must be handled during coil assembly.

Thus, it would be desireable to provide an insulated magnet wire which can be readily manufactured and which can serve to provide adequate insulation for a coil without wasting valuable raw materials.

SUMMARY OF THE INVENTION

The present invention provides a method of forming electrically insulated magnet wire that streamlines the manufacturing process by its steps of applying adhesive to a passing insulating tape and then promptly adhering the coated tape to a passing wire. The inefficient prior art methods which first create or procure a prefabricated adhesive coated tape, and then reactivate the adhesive during wire wrapping have been improved upon while still allowing for partial, longitudinal wire wrapping.

In one form thereof, the present invention provides a method of forming an electrically insulated wire and includes the step of providing a supply of tape and a supply of heat activated adhesive, wherein at least one of the tape and adhesive provides a means for electrical insulation, and wherein when the tape comprises the means for electrical insulation the tape comprises at least one of a material of construction having an electrically insulative property and a material of construction adapted to absorb an electrically insulating material in an environment in which the electrically insulated wire is to be employed. The method also involves moving a conductor wire along a first path, and moving the tape along a second path, wherein the first and second paths converge to a mounting zone whereat the tape is mounted to the wire. The method further involves heating the adhesive to an adhering state, applying the adhesive to the tape in the adhering state at a location along the second path, and, at the mounting zone, adhering the tape to the wire with the adhesive in the adhering state to provide at least a portion of the periphery of the wire with an electrically insulative wrap.

In another form thereof, the present invention provides a method of forming an electrically insulated magnet wire and includes the steps of feeding a supply of conductor wire along a first path, feeding a flexible electrical insulation tape along a second path, wherein the first and second paths converge to a mounting zone whereat the tape is mounted to the wire, and heating a heat activated adhesive with dielectric properties to an adhering state. The method further involves applying the adhesive to the tape in the adhering state at a location along the second path prior to the mounting zone, and, at the mounting zone, adhering the tape to the wire with the adhesive in the adhering state to provide a longitudinal wrap along the wire, wherein the longitudinal wrap covers only a portion of the periphery of the wire.

One advantage of the present invention is that an insulated magnet wire can be produced without the use of release strips or prefabricated, adhesive coated insulating tapes.

Another advantage of the present invention is that a magnet wire can be longitudinally and partially wrapped in a convenient, and raw materials efficient, manner.

Another advantage of the present invention is that a partial wrapping of a magnet wire with an insulating resin may be performed.

Still another advantage of the present invention is that a magnet wire coil can be provided with adequate turn-to-turn electrical insulation without the magnet wire insulation being wrapped around the entire wire periphery.

Still another advantage of the present invention is that a heat activated adhesive may be employed without requiring additional heating of the wire prior to or after application of the insulating wrap.

BRIEF DESCRIPTION OF THE DRAWINGS

The above mentioned and other advantages and objects of this invention, and the manner of attaining them, will become more apparent and the invention itself will be better understood by reference to the following description of the invention taken in conjunction with the accompanying drawings, wherein.

Corresponding reference characters indicate corresponding parts throughout the several views. Although the drawings represent the invention, the drawings are not necessarily to scale and certain features may be exaggerated or omitted in order to better illustrate and explain the present invention.

DESCRIPTION OF THE PREFERRED EMBODIMENT

Figure 1:
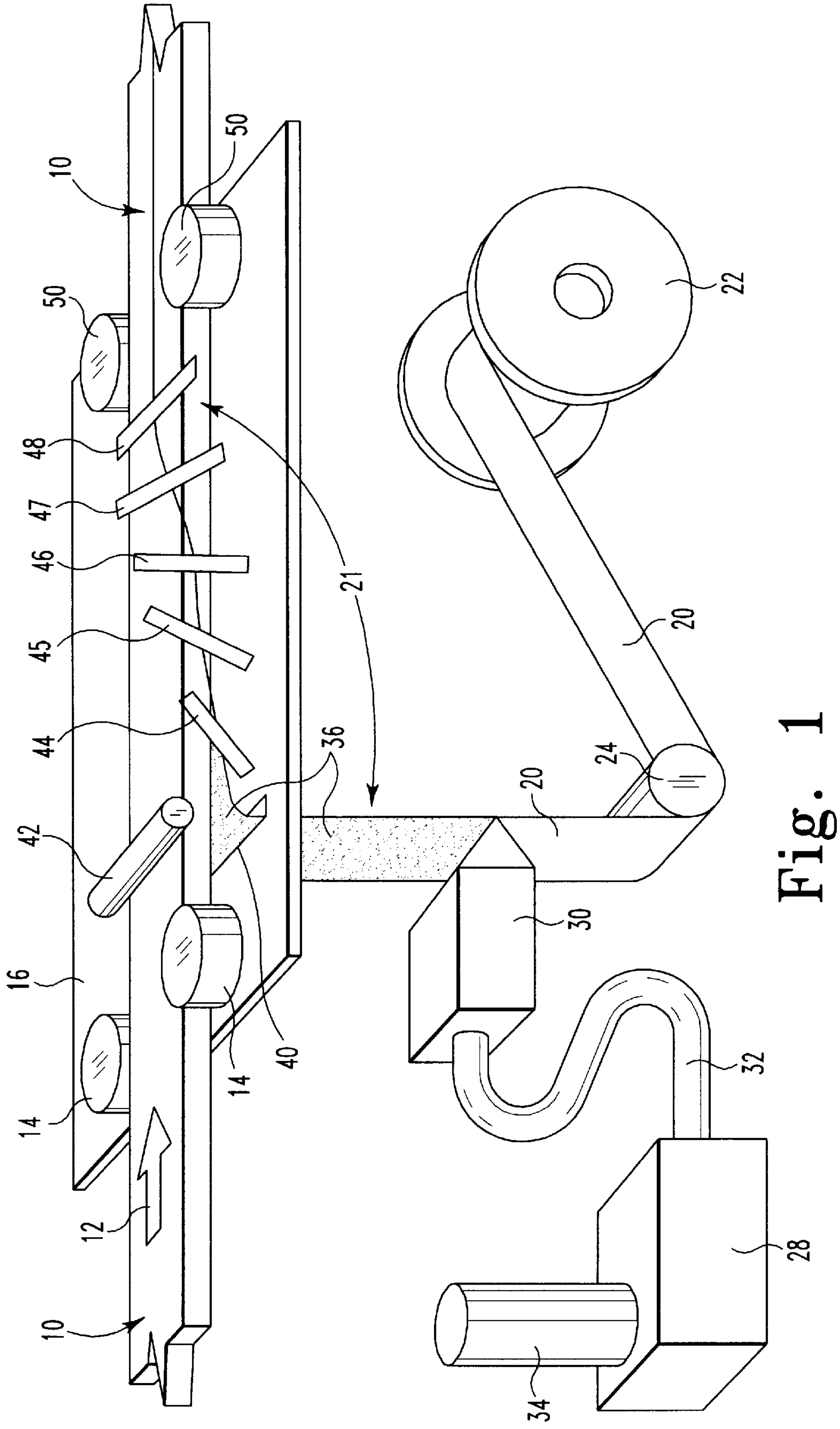
FIG. 1 is a schematic representation of the method of the present invention being practiced to produce a magnet wire having a partial, longitudinal wrapping or covering of electrically insulative materials.
Figure 2C:
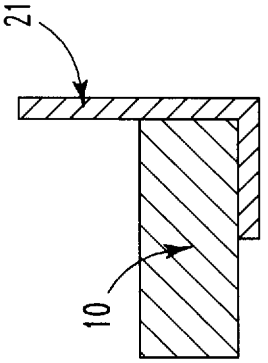
FIGS. 2*a*–2*e* are diagrammatic, transverse cross-sectional views looking downstream along the wire travel path of the magnet wire and the insulative wrapping at successive stages of the wire wrapping process.
Figure 2B:
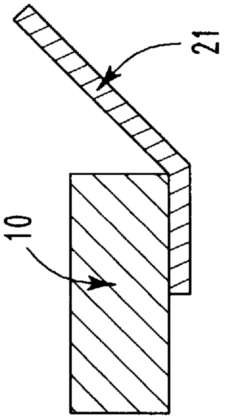
Figure 2A:
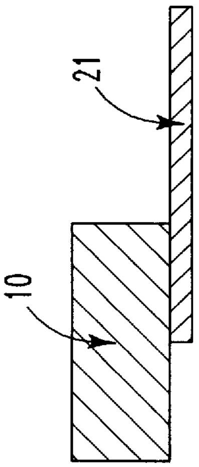
Figure 2E:
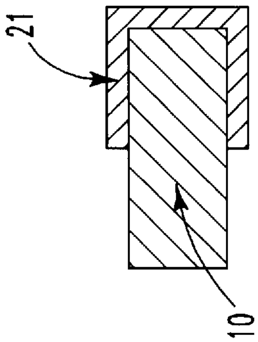
Figure 2D:
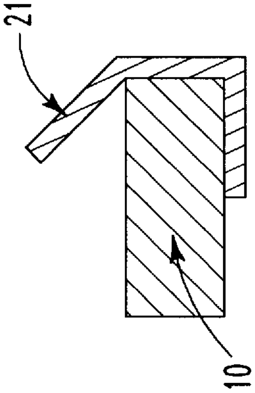

Referring now to FIG. 1, there are schematically shown selected components of the equipment which may be utilized according to the present invention to wrap an electrical conductor wire, such as magnet wire, in an electrically insulative material. In FIG. 1, structural portions of the equipment which may be of any suitable type known in the art have been abstractly shown or omitted in the interest of clarity of illustration, and further because the construction of such portions are not essential to an understanding of the present invention.

A continuous supply of conductor wire 10 to be wrapped in electrically insulating material is unwound from a supply spool (not shown) and is continuously fed in a direction indicated at 12 between a pair of guide rollers 14 mounted on wrapping plate 16. Because of the manner in which the wrapping is adhesively mounted, wire 10 may be at room temperature when it reaches plate 16 for wrapping. Conductor wire 10 is shown as having a rectangular shaped transverse cross-section especially suited for windings in large transformers. Differently shaped wires, for example a square or round wire, may alternatively be employed within the scope of the present invention. Conductor wire 10 is typically formed of aluminum or copper, but may be formed of other electrically conductive materials, and further may be either bare or varnish coated as is known in the art.

A continuous, substantially flexible web or tape 20 which during the inventive process is coated with adhesive and substantially simultaneously mounted to passing wire 10 is unwound from a reel 22. While tape 20 and wire 10 travel along their respective paths at equal speeds to ensure a proper wrapping, these speeds are variable. Experience has shown that speeds in the range of about 20–400 feet per minute, and typically about 200 feet per minute on average, are attainable with the present invention. These speeds may be adjusted depending on the time it takes for the adhesive to cure, as wrapping is desirably completed before the adhesive cures. Because tape 20 is wrapped longitudinally along wire 10 as described below, tape 20 has a width equal to the dimension of the cross-sectional periphery of wire 10 to be wrapped. The present invention can be practiced to provide either complete or partial wrapping of the wire periphery, and the width of tape 20 can be selected by one of skill in the art based on the size of the wire to be wrapped.

Tape 20 is typically intended to serve as a layer of electrical insulation on a wrapped magnet wire product, and therefore the material of tape 20 can comprise one of a variety of materials having strong dielectric properties already well known to those of skill in the art. For example, tape 20 may be a fibrous or fabric material made of one or more of glass fibers, or aramid fibers. One highly suitable spun-laced aramid fiber material available from DuPont is known as 417 NOMEX®, and additional aramid fiber materials which are less flexible but which may alternatively be utilized are known as 414 NOMEX® and 410 NOMEX®. The thickness of the tape is typically dependent on the level of insulation required and the material of construction. In addition, in circumstances where the adhesive of the present invention which is applied to tape 20 provides sufficient electrical insulation for wire 10, tape 20 can be formed of a non-insulating material or of a sacrificial paper which may be removed and discarded after transferring the adhesive to wire 10.

For use in certain devices, the material of tape 20 does not serve as an electrical insulator but serves as a spacer between adjacent magnet wire turns. The tape ultimately absorbs or is permeated by substances in the environment in which it operates to provide suitable electrical insulation between the wire turns. For example, for use in oil filled transformers, tape 20 can comprise a substantially non-insulating material such as a porous or woven nylon, or a kraft type paper. When for example a transformer with woven nylon tape is submerged in oil, the oil penetrates or fills the pores or openings within the nylon such that the nylon tape effectively absorbs the oil. The oil in the tape serves as an electrical insulator for the magnet wire and also dissipates heat.

Still referring to FIG. 1, the adhesive-free and room temperature tape 20 is routed over spring-biased roller 24 and past the applicator which applies a film coating of a hot melt adhesive to a presented surface of the tape. Although not shown, a second motor driven pinch roller cooperating with roller 24 squeezes tape 20 therebetween in order to pull the tape off the roll. This applicator is schematically shown as including a hot melt machine 28 connected to gun or slot nozzle 30 via hose 32. In operation, a quantity of heat activated adhesive in a solid state is introduced through hopper 34 into hot melt machine 28. To protect some adhesives from experiencing an adverse reaction with atmospheric air which might produce, for example, a discoloration of the adhesive, the applicator can be provided with an apparatus (not shown) which after adhesive introduction fills hopper 34 with an inert gas to flush oxygen from the hopper. The adhesive is heated to a semi-solid state, or in other words to a high viscosity liquid state, in hot melt machine 28 and flows through hose 32 to be extruded out nozzle 30 to provide a uniformly thick, film coating indicated at 36 across the full width of tape 20. For purposes of further explanation herein, the adhesive and the segment of the tape covered by the adhesive downstream of the applicator is collectively referenced as 21 hereinafter. A suitable applicator is the Nordson 4512 system available from Nordson Corporation of Duluth, Ga.

The adhesive applied to tape 20 is a heat activated adhesive having either thermoplastic or thermoset properties. As used herein, a heat activated adhesive refers to an adhesive which at temperatures of around room temperature and below is in the form of a non-adhering or non-sticky solid, and which upon application of sufficient heat energy melts or softens to a semi-solid state or condition. In this semi-solid condition, the adhesive is unset and exists in an adhering or sticky state suitable for adhering objects together. When the heated, semi-solid adhesive subsequently experiences sufficient cooling, the adhesive sets or cures to bind together materials which the adhesive in the adhering state had previously been sandwiched between.

A variety of known heat activated adhesives may be employed in the practice of the present invention. One suitable adhesive is a thermosetting polyamide resin available from Bostik, Inc., of Middleton, Mass. as Bostik HM 4240. This polyamide adhesive has a dielectric constant of 3.5, a dielectric strength of 180 kv/cm, and a volume resistivity of $2\times10^{23}$ ohms/cm . In practice, this adhesive is heated in hot melt machine 28 to a temperature of 450° F., at which point its melt viscosity is about 1600 centipoise. This adhesive is recommended for application by conventional hot melt applicators at temperatures between about 375° F., at which point the melt viscosity is around 6750 centipoise, and about 425° F.

Due to its electrical insulating properties, polyamide adhesive 36 serves as a insulation layer on wire 10 and allows a smaller thickness of insulating tape 20 to be used to achieve a desired total level of insulation. The insulating properties also make possible the use of the sacrificial tape to impart a partial or full wrapping of a wire with resin only. Other heat activated adhesives, including those with similar dielectric properties, may alternatively be employed.

The travel paths of wire 10 and tape 21 converge at a mounting zone whereat the adhesive coated tape is actually mounted or glued to conductor wire 10. In particular, adhesive coated tape 21 passes through a slot 40 in plate 16 such that a selected portion of the tape width is directly underneath the bottom periphery of wire 10. A roller abstractly shown at 42 biases wire 10 downward such that the adhesive coated tape 21 is sandwiched between wire 10 and plate 16 to effect adherence of tape 21 to wire 10. Roller 42 may be biased downward against wire 10 by any suitable device, such as a pneumatic cylinder.

As wire 10 and tape 21 continue to travel along their now common path, a series of progressive wipes abstractly shown at 44, 45, 46, 47 and 48 encounter tape 21 to assist in the longitudinal and partial wrapping of wire 10. Wipes 44–48 each comprise a substantially rigid but non-scratching material, such as hard felt, configured in a squeegee-like configuration. Wipes 44–48 systematically arrange and then press the advancing, adhesive coated tape 21 against the advancing wire 10. In step-wise fashion, FIGS. 2*a*–2*e* illustrate the overall manner in which tape 21 is folded onto wire 10. Depending on the wire shapes to be wrapped as well as the wrapping arrangements desired, different wipe shapes and configurations, or other wrapping components such as rollers, may be substituted for the shown wipes 44–48 to force the tape 21 with the unset adhesive into contact with wire 10 to achieve proper wrapping. After the longitudinal wrapping process has been completed, the now wrapped conductor wire 10 slidingly advances past guide rollers 50 and is wound upon a take-up reel (not shown) for later use.

In order for adhesive 36 to achieve a secure bond between tape 20 and wire 10 around the full portion of the wire periphery which is being wrapped, adhesive 36 is extruded onto tape 20 at a location in close proximity to the tape mounting zone such that the applied adhesive does not set or cure, i.e. does not transform from the adhering state to a solid, non-sticky state, before wrapping is completed. For tape and wire speeds of about 200 feet per minute at a room temperature of approximately 70° F., nozzle 30 is arranged to apply a film thickness, typically in the range of 1–8 mils plus or minus 0.5 mil as desired, of the above mentioned polyamide adhesive 36 at 425° F. to the portion of the moving tape 20 which is approximately three inches away from the point where tape 20 passes through slot 40 and mounts to wire 10. For greater wrapping speeds, and for warmer wrapping environments, the adhesive application point can naturally be further upstream along the tape travel path without risk of the adhesive setting before it glues the tape and wire together.

In an alternate embodiment not shown, a heating element may be positioned between the adhesive application zone and the tape mounting zone. The heating element may supply additional energy to maintain adhesive 36 in an adhering state for a longer period of time, or serve to reheat a thermoplastic adhesive which may have already at least partially set after its application to tape 20.

Figure 4:
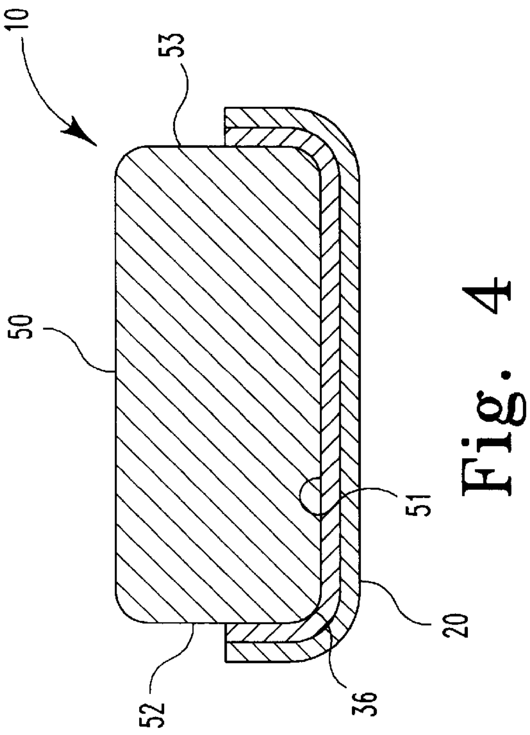
FIGS. 3–5 are cross-sectional views of three different, partial insulative wrappings of magnet wires which can be achieved with the method of the present invention.
Figure 3:
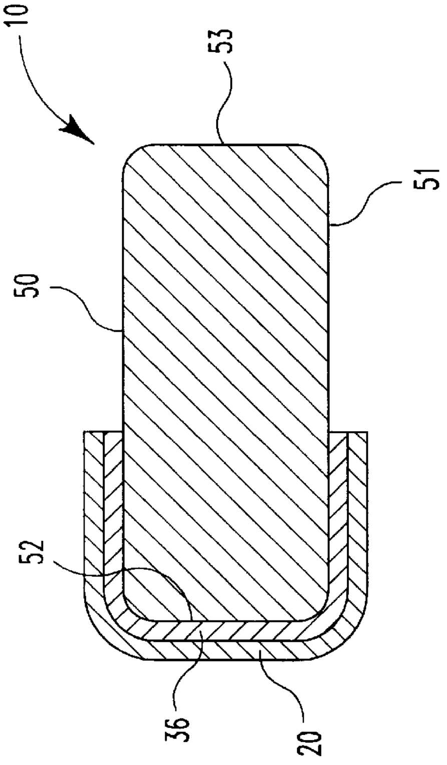
Figure 5:
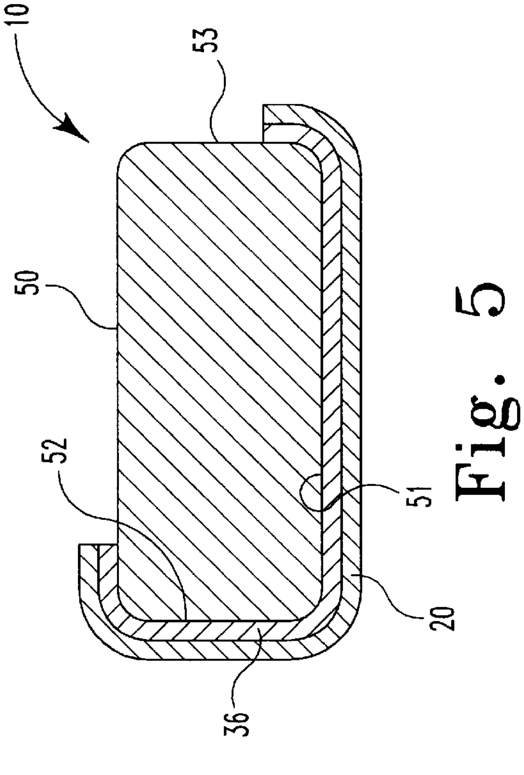

Referring now to FIGS. 3–5, there are shown transverse cross-sectional views of various partial wire wrapping configurations which may be separately performed according to the process of the present invention. In each of FIGS. 3–5, a rectangular wire 10 is shown including parallel top and bottom surfaces 50, 51 and parallel side surfaces 52, 53 which meet at radiused corners. For some applications, the wire surfaces may be configured in other shapes, such as a trapezoidal shape. In FIG. 3, the longitudinal wrapping process partially wraps wire 10 in a C-shaped wrap, wherein the layer of adhesive 36 and tape 20 completely cover side surface 52 and adjacent portions of each of top and bottom surfaces 50, 51 to prevent turn to turn current jumping. FIG. 4 discloses a U-shaped partial wrapping wherein adhesive 36 and tape 20 completely cover bottom surface 51 and adjacent portions of each of the side surfaces 52, 53. FIG. 5 discloses still another wrapping configuration, namely an L-shaped partial wrapping, where adhesive 36 and tape 20 completely cover bottom surface 51 and side surface 52 as well as adjacent portions of both top surface 50 and side surface 53. For any particular application, these and other possible configurations can be selected from by a transformer design engineer of ordinary skill.

Figure 6:
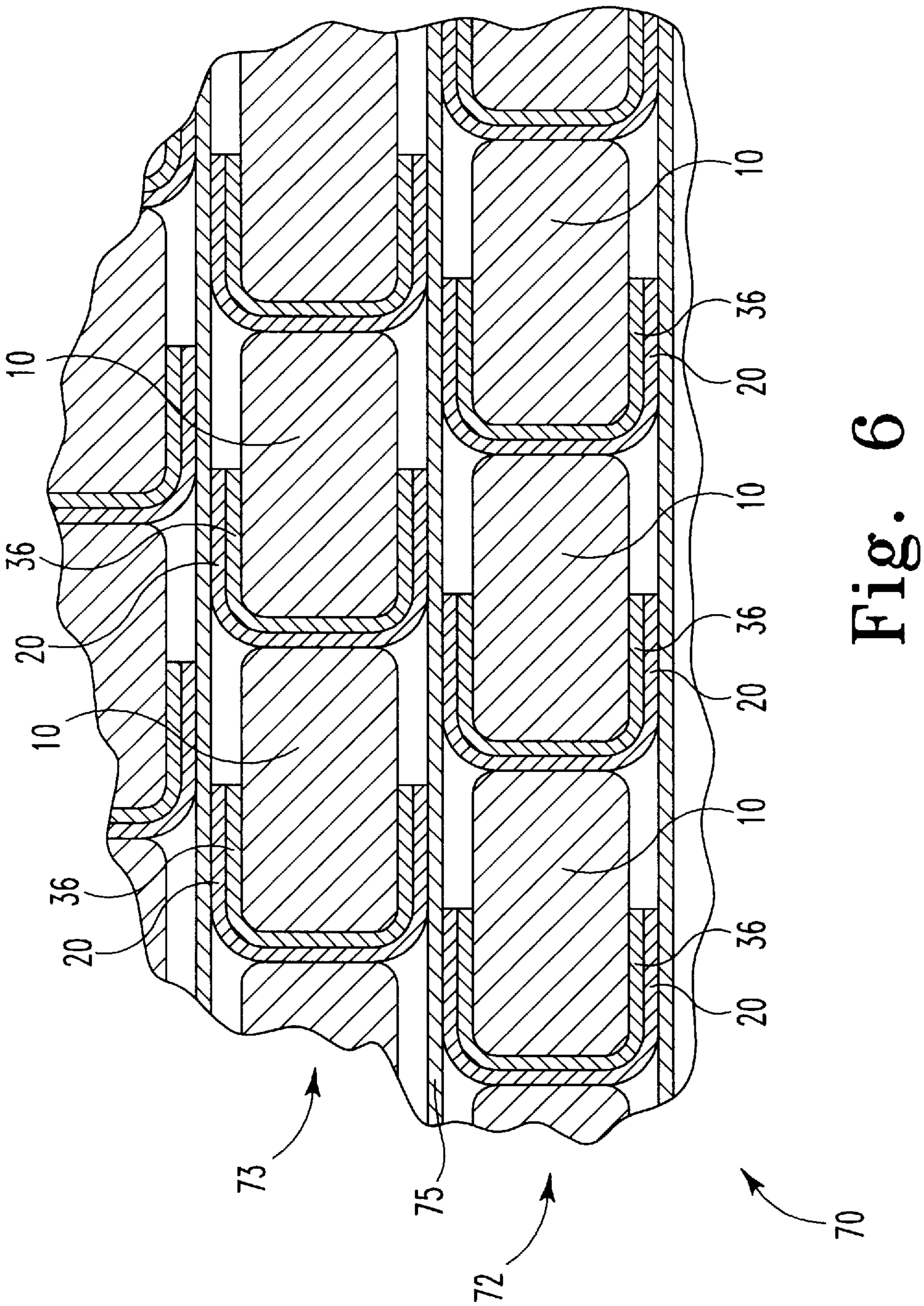
FIG. 6 is a fragmentary, longitudinal cross-sectional view of an insulated magnet wire coil of the present invention.

Referring now to FIG. 6, there is shown a fragmentary, cross-sectional view of a coil, such as used in a transformer, assembled using electrically insulated magnet wire of the present invention. The coil, generally designated 70, includes first layer 72 and second layer 73 of traversely wound, wrapped magnet wire. A layer of electrical insulation 75, which is provided by winding or wrapping a sheet of NOMEX® around wire layer 72 before layer 73 is traversely wound thereover, prevents electrical current from jumping layer to layer. Different numbers of layers and layer-to-layer insulations may naturally be employed depending on the requirements of the coil. Adhesive 36 and tape 20 provide turn-to-turn insulation for the wrapped magnet wire being used to form coil 70. In particular, the bare or exposed side surface of each winding of the magnet wire 10 faces the electrical insulation wrap on the subsequent wire winding. The rectangular shape of the magnet wire aids in ensuring that the rotational orientations of the windings of magnet wire are uniform such that the turn-to-turn insulation is properly arranged between successive windings. It will be appreciated that turn-to-turn insulation is achieved with a limited amount of adhesive and tape which advantageously limits costs.

While this invention has been described with reference to particular products and processes, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A method of forming an electrically insulated magnet wire comprising the steps of:

providing a bare conductor wire having a polygonal cross section;

providing a supply of tape and a supply of heat activated adhesive, wherein at least one of said tape and said adhesive comprises a means for electrical insulation, and wherein when said tape comprises said means for electrical insulation said tape comprises at least one of a material of construction having an electrically insulative property and a material of construction adapted to absorb an electrically insulating material in an environment in which the electrically insulated wire is to be employed;

moving said conductor wire along a first path;

moving said tape along a second path, wherein said first path and said second path converge to a mounting zone whereat said tape is mounted to said wire;

heating said adhesive to an adhering state;

thereafter, at a location along said second path, applying said adhesive to said tape in said adhering state; and at said mounting zone, adhering said tape to said wire, in a longitudinal direction said wire, with said adhesive in said adhering state to provide at least a portion of the periphery of said wire with an electrically insulative wrap.

2. The method of claim 1 comprising performing the adhesive applying step in sufficient proximity to said mounting zone such that said adhesive applied to said tape remains in said adhering state until reaching said mounting zone and without the application of additional heat energy to thereby prevent the onset of adhesive curing.

3. The method of claim 1 wherein said heat activated adhesive is electrically insulative and wherein said tape comprises a flexible electrical insulation tape.

4. The method of claim 1 wherein said longitudinal wrap covers only a part of said wire periphery.

5. The method of claim 4 wherein said wire periphery comprises a generally rectangular shape including first and second side surfaces, a top surface and a bottom surface, and wherein said side surfaces are each shorter than said top surface.

6. The method of claim 5 wherein said wrap comprises a C-shaped wrap covering only said first side surface and portions of said top surface and said bottom surface immediately adjacent said first side surface.

7. The method of claim 1 wherein said heat activated adhesive comprises an electrically insulative property.

8. The method of claim 7 wherein said heat activated adhesive comprises polyamide.

9. The method of claim 1 wherein said heat activated adhesive comprises an electrically insulative property, wherein said tape comprises a flexible electrical insulation tape, wherein said tape adhering step comprises providing a longitudinal wrap, wherein said longitudinal wrap covers only a part of said wire periphery, and wherein said wire periphery comprises a generally rectangular shape.

10. The method of claim 1 wherein said heat activated adhesive comprises an electrically insulative property, wherein said tape comprises a sacrificial material, and wherein said method further comprises the step of removing said tape after curing of said adhesive.

11. The method of claim 10 wherein said adhesive covers only a part of said wire periphery.

12. The method of claim 1 wherein said tape adhering step further comprises pressing said tape toward said wire with a series of progressive wipes.

13. A method of forming an electrically insulated magnet wire comprising the steps of:

providing a bare conductor wire having a polygonal cross section;

continuously feeding a supply of said conductor wire along a first path;

continuously feeding a flexible electrical insulation tape along a second path, wherein said first path and said second path converge to a mounting zone whereat said tape is mounted to said wire;

heating a heat activated adhesive to an adhering state, said adhesive having an electrical insulative property;

at a location along said second path prior to said mounting zone, applying to said tape said adhesive in said adhering state; and at said mounting zone, adhering said tape to said wire with said adhesive in said adhering state to provide a longitudinal wrap along said wire, said longitudinal wrap covering only a portion of the periphery of said wire.

14. The method of claim 13 wherein said heat activated adhesive comprises a polyamide.

15. The method of claim 13 wherein said periphery of said wire comprises a rectangular shape.

16. The method of claim 13 comprising performing the adhesive applying step in sufficient proximity to said mounting zone such that said adhesive applied to said tape remains in said adhering state until reaching said mounting zone without application of additional heat energy.

17. The method of claim 13 comprising performing the adhesive applying step in sufficient proximity to said mounting zone such that said adhesive applied to said tape remains in said adhering state until said tape is fully longitudinally wrapped without application of additional heat energy.

* * * * *